United States Patent
Lo et al.

(10) Patent No.: US 11,227,854 B2
(45) Date of Patent: Jan. 18, 2022

(54) SEMICONDUCTOR PACKAGE

(71) Applicant: Realtek Semiconductor Corp., HsinChu (TW)

(72) Inventors: Chin-Yuan Lo, HsinChu (TW); Nan-Chin Chuang, HsinChu (TW); Chih-Hao Chang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 53 days.

(21) Appl. No.: 15/930,418

(22) Filed: May 12, 2020

(65) Prior Publication Data
US 2021/0118846 A1    Apr. 22, 2021

(30) Foreign Application Priority Data
Oct. 21, 2019    (TW) .................... 108137819

(51) Int. Cl.
| | | |
|---|---|---|
| *H01L 25/065* | (2006.01) | |
| *H01L 23/00* | (2006.01) | |
| *H01L 23/31* | (2006.01) | |
| *H01L 23/498* | (2006.01) | |

(52) U.S. Cl.
CPC ...... *H01L 25/0652* (2013.01); *H01L 23/3128* (2013.01); *H01L 23/49816* (2013.01); *H01L 24/48* (2013.01); *H01L 2224/48227* (2013.01); *H01L 2225/0651* (2013.01)

(58) Field of Classification Search
CPC ............. H01L 25/0652; H01L 25/0655; H01L 2225/06506
See application file for complete search history.

(56) References Cited

U.S. PATENT DOCUMENTS

2013/0062783 A1* 3/2013 Lin .................. H01L 23/49565
                                                            257/777
2019/0259695 A1    8/2019 Gandhi

FOREIGN PATENT DOCUMENTS

| TW | 200631148 | 9/2006 |
|---|---|---|
| TW | 201810600 A | 3/2018 |

* cited by examiner

*Primary Examiner* — Yu-Hsi D Sun
(74) *Attorney, Agent, or Firm* — Winston Hsu

(57) ABSTRACT

A semiconductor package includes a carrier substrate including opposite first surface and second surface; a first chip and a second chip mounted on the first surface of the carrier substrate in a side-by-side manner, wherein the first chip has a plurality of high-speed signal pads disposed along its first side adjacent to the second chip, and the second chip has a plurality of data (DQ) pads along its second side adjacent to the first chip; and a plurality of first bonding wires, directly connecting the plurality of high-speed signal pads to the plurality of data (DQ) pads.

10 Claims, 3 Drawing Sheets

SEMICONDUCTOR PACKAGE

BACKGROUND OF THE INVENTION

1. Field of the Invention

The present invention relates generally to semiconductor packaging and, more particularly, to system-in-package (SiP) packaging.

2. Description of the Prior Art

As portable electronic devices become smaller, the dimensions of semiconductor packages in the electronic devices must also be reduced. To help accomplish this, system-in-package (SiP) technology is widely used because it can increase the capacity of the semiconductor package. FIG. 1 is a schematic cross-sectional view showing a prior art SiP package. As shown in FIG. 1, the conventional SiP package 1p is provided with a plurality of dies $C_1$ and $C_2$ disposed on a package substrate S. The dies $C_1$ and $C_2$ can be bonded to the gold fingers $F_1$ and $F_2$ on the package substrate S through wire bonding wires $W_1$ and $W_2$, respectively, thereby forming signal connection between the dies $C_1$ and $C_2$ via the trace T in the package substrate S.

The high-speed signal communication between the dies $C_1$ and $C_2$ must pass through the longer connection path that is composed of the bonding wire $W_1$, the gold finger $F_1$ on the package substrate S, the trace T in the package substrate S, the gold finger $F_2$ on the package substrate S, and the bonding wire $W_2$. However, the signal connection path formed by the above wire bonding technique has signal integrity problems, such as high insertion loss, high return loss, margin loss, and channel resonance, due to impedance discontinuity and high crosstalk between bonding wires.

SUMMARY OF THE INVENTION

One object of the present invention is to provide an improved semiconductor package that can alleviate the deficiencies and shortcomings of the prior art described above.

According to one aspect of the invention, a semiconductor package includes a carrier substrate having a first surface and a second surface opposite to the first surface. A first chip and a second chip are mounted on the first surface of the carrier substrate in a side-by-side manner. The first chip is provided with a plurality of high-speed signal pads along a first side adjacent to the second chip, and the second chip is provided with a plurality of data (DQ) pads along a second side adjacent to the first chip. A plurality of first bonding wires directly connects the plurality of high-speed signal pads to the plurality of DQ pads.

According to some embodiments, the first chip and the second chip are secured onto the first surface of the carrier substrate by an adhesion layer.

According to some embodiments, a plurality of solder balls is disposed on the second surface of the carrier substrate, and wherein the solder balls are ball grid array (BGA) solder balls.

According to some embodiments, the first chip comprises system-on-a-chip (SoC), and the second chip comprises a die stack or a memory chip package.

According to some embodiments, a plurality of passive components is disposed on the first surface of the carrier substrate.

According to some embodiments, the plurality of DQ pads is disposed on a redistribution layer (RDL).

According to some embodiments, the second chip is provided with a plurality of command/address (CA) pads along a third side remote from the first chip, and wherein the semiconductor package further comprises a plurality of second bonding wires directly connecting the plurality of CA pads corresponding gold fingers on the first surface of the carrier substrate.

According to some embodiments, the semiconductor package further comprises an encapsulant covering the first chip and the second chip.

According to some embodiments, the second chip is provided with a plurality of power/ground (P/G) pads on a fourth side between the second side and the third side.

According to some embodiments, the semiconductor package further comprises a plurality of third bonding wires directly connecting the P/G pads to corresponding gold fingers on the first surface of the carrier substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
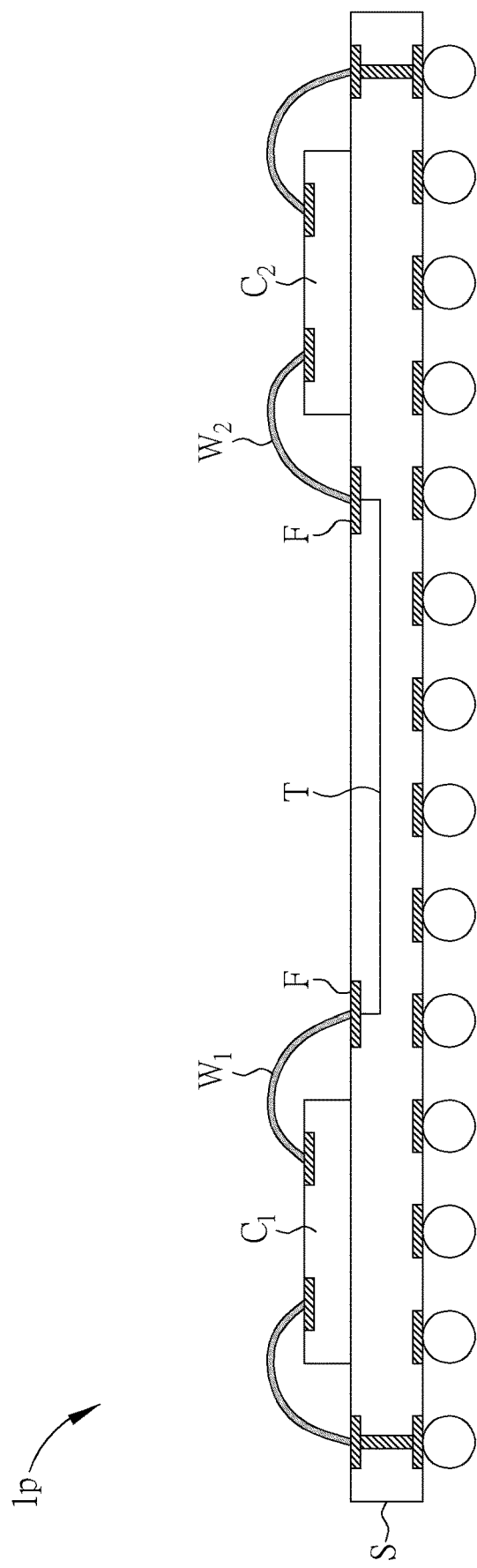
FIG. 1 is a schematic cross-sectional view showing a prior art SiP package.

In the following, the details will be described with reference to the drawings, which also form part of the detailed description of the specification, and are described in the manner of the specific example in which the embodiment can be practiced. The following examples have been described in sufficient detail to enable those of ordinary skill in the art to practice. Of course, other embodiments may be utilized, or any structural, logical, or electrical changes may be made without departing from the embodiments described herein. Therefore, the following detailed description is not to be considered as limiting, but the embodiments included therein are defined by the scope of the accompanying claims.

It is to be understood that although the terms "first" or "second" may be used to describe respective elements, regions, layers and/or parts, however, these elements, regions, layers and/or parts are not limited by these terms. These terms are only used to distinguish one element, region, layer from another element, region, layer, Thus, the first element, region, layer or part discussed below may be referred to as a second element, region, layer or part without departing from the teachings of the exemplary embodiments.

For convenience of description, spatially relative terms such as "under", "below", "lower", "above", "upper", etc. may be used. The terms are used to describe the relationship between one element or feature and another element or feature. It will be understood that the spatially relative terms are used to summarize different orientations of the device in use or operation. For example, elements that are "under" or "beneath" other elements or features will be "above" the other elements or features if the device in the figures is flipped or rotated. Thus, the exemplary term "below" can encompass both "above" and "below". The device can take other orientations (such as 90 degrees of rotation), and the spatial relativity used here are interpreted accordingly.

The term "horizontal" as used herein is defined as a plane parallel to the major or major surface of a semiconductor wafer or wafer substrate, regardless of its orientation. The term "vertical" refers to the direction perpendicular to the "horizontal plane" just defined. When using terms such as "on", "under", "bottom", "top", "side" (such as "sidewall"), "higher", "lower", etc. they are interpreted as the position relative to the definition of the horizontal plane.

The present invention relates to an improved semiconductor package, particularly a Wire-Bonding System-in-Package (WBSiP). As mentioned earlier, SiP technology is widely used because it can increase the capacity of semiconductor packages. However, the high-speed signal communication between the dies in the SiP requires an electrical connection path formed by the wire bonding, the gold fingers on the package substrate, and the traces in the package substrate, resulting in signal distortion. The present invention addresses such problems.

Hereinafter, the term "system-in-package" or "SiP" refers to a plurality of IC chips or dies having different functions being molded in a single package. The term "wire-bonding system-in-package" or "WBSiP" refers to packaging a plurality of chips or dies together and connecting them to each other by wire bonding. The term "system-on-a-chip" or "SoC" refers to an integrated circuit that integrates various components of a computer or other electronic system into a single chip. The term "known-good-die" or "kgd" refers to a known acceptable die.

Figure 2:
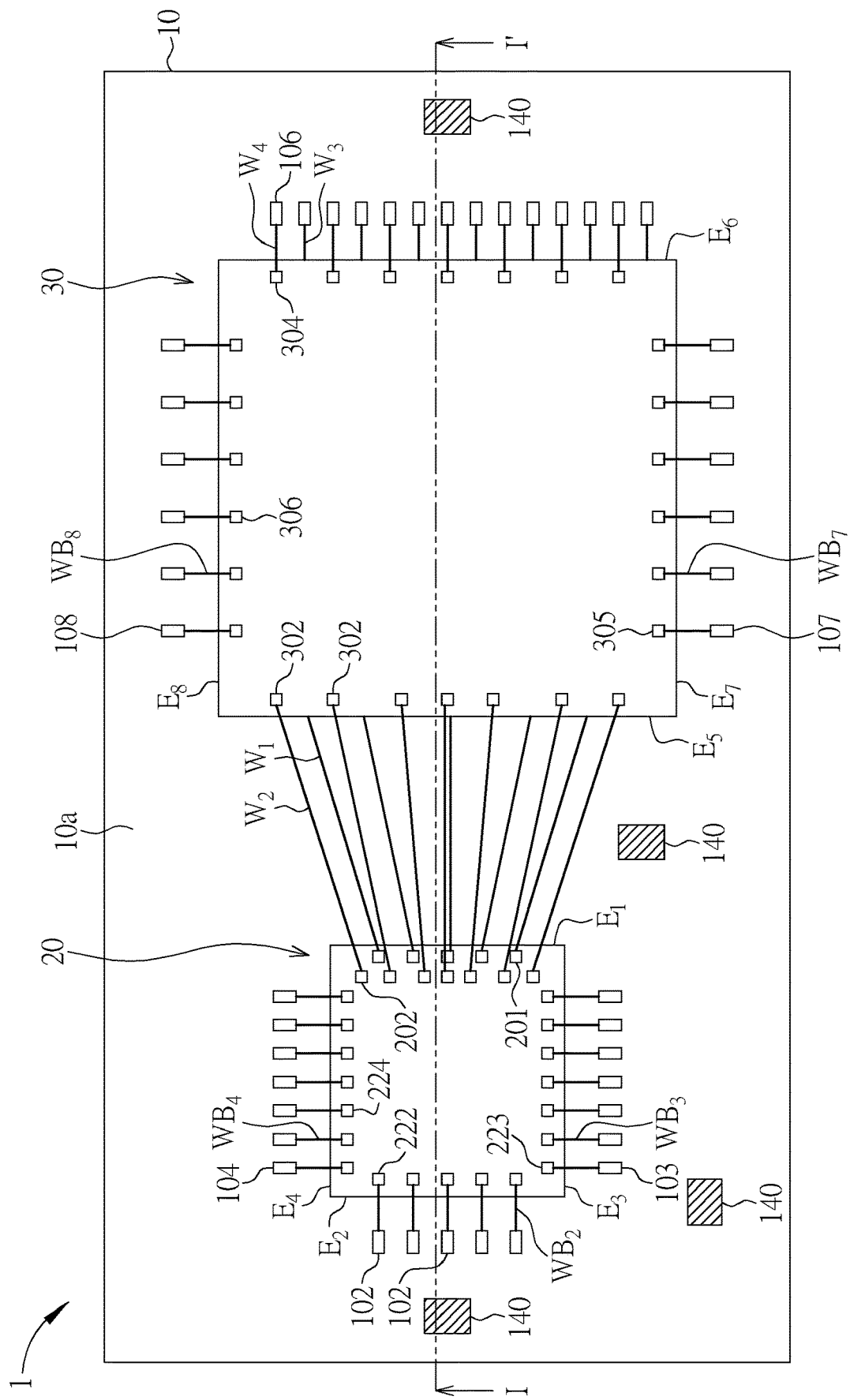
FIG. 2 is a top perspective view of the semiconductor package according to an embodiment of the invention.
Figure 3:
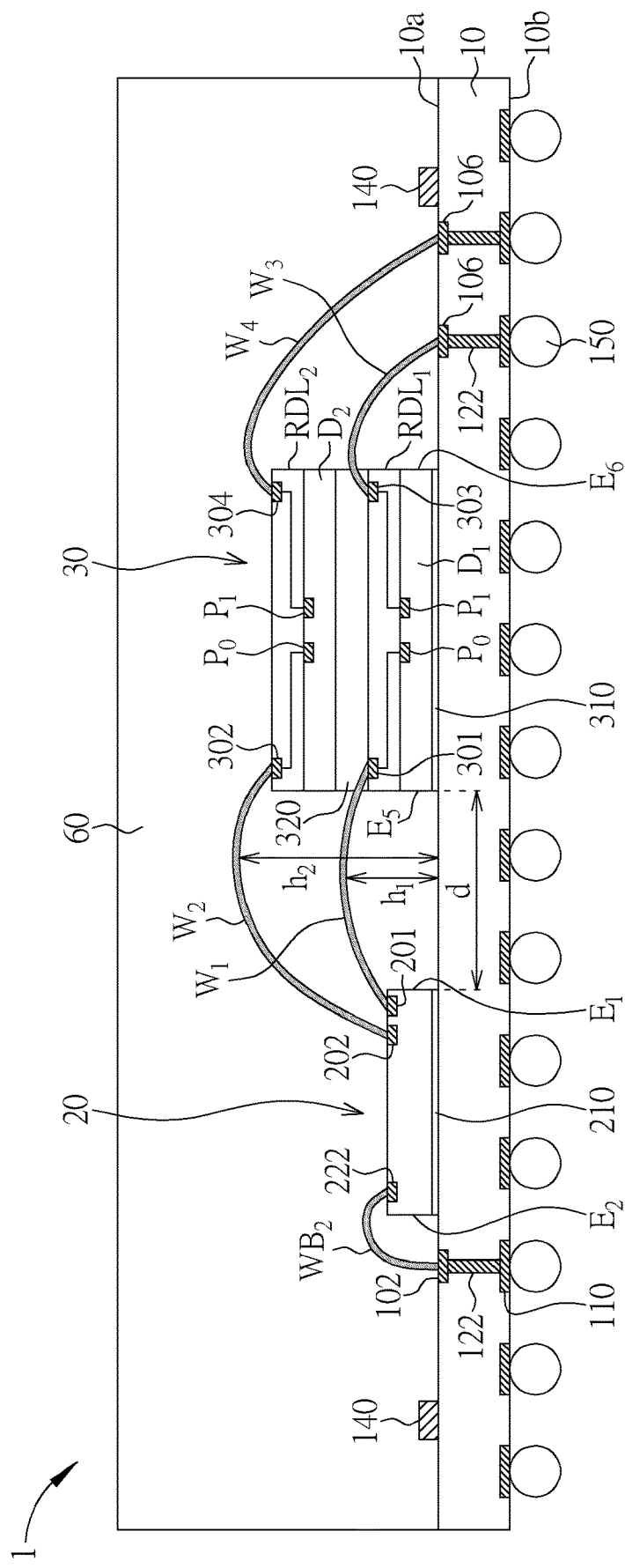
FIG. 3 is a cross-sectional view taken along line I-I' of FIG. 2.

Please refer to FIG. 2 and FIG. 3, wherein FIG. 2 is a top perspective view of the semiconductor package according to an embodiment of the invention, and FIG. 3 is a cross-sectional view taken along line I-I' of FIG. 2. As shown in FIG. 2 and FIG. 3, the semiconductor package 1 includes a carrier substrate 10 having opposite first surface 10a and second surface 10b. The semiconductor package 1 may be a SiP. According to an embodiment of the invention, at least a first chip 20 and a second chip 30 are disposed on the first surface 10a of the carrier substrate 10. For example, the first chip 20 and the second chip 30 may be secured onto the first surface 10a of the carrier substrate 10 with adhesive layers 210 and 310, respectively. A plurality of solder balls 150, for example, ball grid array (BGA) solder balls, may be disposed on the second surface 10b of the carrier substrate 10. The solder balls 150 may be reflowed subsequently to attach the semiconductor package 1 to a printed circuit board (PCB) or a motherboard (not shown). According to an embodiment of the invention, the carrier substrate 10 may be a multilayer circuit board or a package substrate. For example, the carrier substrate 10 may be a two-layer, three-layer or four-layer circuit board, but is not limited thereto.

For example, the carrier substrate 10 may be an organic package substrate comprising metal traces and resin such as bismalemide triazene (BT) epoxy resin or the like. Those skilled in the art will appreciate that other materials may be used to form the carrier substrate 10, such as ceramic or plastic. For the sake of simplicity, the internal routing of the carrier substrate 10 in FIG. 3 only schematically shows a portion of the gold fingers 102, 106 and some vias 122 connected to the solder ball pads 110, wherein the internal wiring can be used to electrically couple the signal of the semiconductor die to the solder balls 150 on the second surface 10b.

According to an embodiment of the invention, for example, the first chip 20 may be a SoC, and the second chip 30 may be a die stack or a memory chip package, such as a dynamic random access memory (DRAM) package, having more than one DRAM die or DRAM kgd, for example, double data rate 3 (DDR3) die or double data rate 4 (DDR4) die. In FIG. 3, for simplification of the description, only two DRAM dies $D_1$ and $D_2$ stacked on top of each other are exemplified. According to an embodiment of the present invention, an insulating film 320 may be disposed between the DRAM dies $D_1$ and $D_2$, for example, an insulating layer formed by a film over wire (FOW) technique. Of course, in other embodiments, DRAM dies $D_1$ and $D_2$ may also be stacked in a stepped manner.

Those skilled in the art will appreciate that the second chip 30 may be a memory package containing multiple (e.g., four or more) DRAM dies. According to an embodiment of the invention, the first chip 20 and the second chip 30 are mounted side by side on the first surface 10a of the carrier substrate 10. According to an embodiment of the invention, the distance d between the first chip 20 and the second chip 30 may range between about 0.5 mm and 4.0 mm. In other embodiments, the distance d between the first chip 20 and the second chip 30 may be more than 4.0 mm.

According to an embodiment of the present invention, a plurality of passive components 140, such as capacitors, inductors, or resistors, may be disposed on the first surface 10a of the carrier substrate 10. According to an embodiment of the invention, for example, the passive component 140 may be decoupling capacitors of 01005 size (0.4 mm×0.2 mm), but is not limited thereto. Further, the first chip 20 and the second chip 30 may be covered by an encapsulant 60 to be isolated from the outside.

According to an embodiment of the invention, for example, the first chip 20 includes four sides $E_1$ to $E_4$. The first chip 20 is provided with a plurality of high-speed signal pads 201 and 202 on the side $E_1$. For example, the high-speed signal pads 201 and 202 can be data (DQ) pads for transmitting high-speed data signals between the first chip 20 and the second chip 30, for example, data transfer rates at 2133 MT/s, 2400 MT/s or 2666 MT/s, but not limited thereto.

According to an embodiment of the invention, for example, the second chip 30 includes four sides $E_5$ to $E_8$. According to an embodiment of the present invention, rewiring layers $RDL_1$ and $RDL_2$ may be disposed on the DRAM dies $D_1$ and $D_2$, respectively, to fan out the pad positions $P_0$ originally located on the active faces of the DRAM dies $D_1$ and $D_2$ to the side E5 on the redistribution layer $RDL_1$ and $RDL_2$ to form bond pads 301 and 302. In accordance with an embodiment of the present invention, the bond pads 301 and 302 formed on the redistribution layers $RDL_1$ and $RDL_2$ adjacent to the side $E_5$ are data (DQ) pads corresponding to the high-speed signal pads 201 and 202. The structures and materials of the redistribution layers $RDL_1$ and $RDL_2$ are well known in the art, and thus the details thereof will not be described herein.

According to an embodiment of the present invention, for example, the redistribution layers $RDL_1$ and $RDL_2$ fan out the pad positions $P_1$ originally located on the active faces of the DRAM die $D_1$ and $D_2$ to the side $E_6$ on the redistribution layers $RDL_1$ and $RDL_2$, respectively, to form bond pads 303 and 304. According to an embodiment of the invention, the side $E_6$ and the side $E_5$ are opposite sides. According to an embodiment of the present invention, for example, the bond pads 303 and 304 formed on the redistribution layers $RDL_1$ and $RDL_2$ adjacent to the side $E_5$ may be pads for transmitting Command/Address (CA) signals (hereinafter CA pads). Further, power supply or ground (Power/Ground, P/G) pads 305 and 306 may be formed on the redistribution layers $RDL_1$ and $RDL_2$ near the sides $E_7$ and $E_8$, respectively.

According to an embodiment of the invention, gold fingers 102, 103, 104 are respectively disposed on the first surface 10a of the carrier substrate 10 along the sides $E_2$, $E_3$, $E_4$ of the first chip 20, and gold fingers 106, 107, and 108 are respectively disposed on the first surface 10a of the carrier substrate 10 along the sides $E_6$, $E_7$, and $E_8$ of the chip 30. The input/output (I/O) pads 222, 223, and 224 disposed on the first chip 20 along the side edges $E_2$, $E_3$, and $E_4$ are electrically connected to the gold finger 102, 103, 104 through the bonding wires $WB_2$, $WB_3$, and $WB_4$, respectively. According to an embodiment of the present invention, the bonding wires $WB_2$, $WB_3$, and $WB_4$ may be gold wires or copper wires, but are not limited thereto.

According to an embodiment of the invention, the plurality of high-speed signal pads 201 and 202 of the first chip 20 disposed on the side $E_1$ are electrically connected to DQ pads 301 and 302 provided along the side $E_5$ on the redistribution layers $RDL_1$ and $RDL_2$ of the second chip 30 through the bonding wires $W_1$ and $W_2$, respectively. According to an embodiment of the present invention, for example, the loop heights $h_1$ and $h_2$ of the bonding wires $W_1$ and $W_2$ are about 0.07 mm and 0.13 mm, respectively, but are not limited thereto. The CA pads 303 and 304 disposed along the side edge $E_6$ on the second chip 20 are electrically connected to the corresponding gold fingers 106 through the bonding wires $W_3$ and $W_4$, respectively. The P/G pads 305 and 306 disposed on the second chip 20 along the side edges $E_7$ and $E_8$ are electrically connected to the corresponding gold fingers 107 and 108 through the bonding wires $WB_7$ and $WB_8$, respectively.

It is one technical feature of the present invention that the high-speed signal pads 201 and 202 of the first chip 20 and the DQ pads 301 and 302 on the redistribution layers $RDL_1$ and $RDL_2$ of the second chip 30 are directly connected by the bonding wires $W_1$ and $W_2$. Therefore, the high-speed signal communication does not need to pass through the gold fingers and traces of the carrier substrate 10. This improves the signal distortion caused by the high-speed signal transmission through the electrical connection path composed of the bonding wires, the gold fingers on the carrier substrate, and the traces in the carrier substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
    a carrier substrate having a first surface and a second surface opposite to the first surface;
    a first chip and a second chip mounted in a side-by-side manner on the first surface of the carrier substrate, wherein the first chip is provided with a plurality of high-speed signal pads along a first side adjacent to the second chip, and the second chip comprises at least two stacked dies, each of which is provided with a plurality of data (DQ) pads and a plurality of command/address signal (CA) pads, wherein the plurality of DQ pads and the plurality of CA pads of the at least two stacked dies are re-distributed to opposite sides of the second chip through respective redistribution layers, wherein the DQ pads of the at least two stacked dies are rearranged along a second side adjacent to the first chip; and
    a plurality of first bonding wires directly connecting the plurality of high-speed signal pads to the plurality of DQ pads of each stacked die of the second chip, wherein the plurality of first bonding wires bonded to the plurality of DQ pads along the second side of the second chip has different loop heights.

2. The semiconductor package according to claim 1, wherein the first chip and the second chip are secured onto the first surface of the carrier substrate by an adhesion layer.

3. The semiconductor package according to claim 1, wherein a plurality of solder balls is disposed on the second surface of the carrier substrate, and wherein the solder balls are ball grid array (BGA) solder balls.

4. The semiconductor package according to claim 1, wherein the first chip comprises system-on-a-chip (SoC), and the second chip is a memory chip package.

5. The semiconductor package according to claim 1, wherein a plurality of passive components is disposed on the first surface of the carrier substrate.

6. The semiconductor package according to claim 1, wherein the at least two stacked dies comprise a first die and a second die stacked on the first die with an insulating layer interposed between the first die and the second die, wherein the plurality of first bonding wires are partially embedded in the insulating layer.

7. The semiconductor package according to claim 1, wherein the plurality of command/address (CA) pads is provided along a third side remote from the first chip, and wherein the semiconductor package further comprises a plurality of second bonding wires directly connecting the plurality of CA pads corresponding gold fingers on the first surface of the carrier substrate.

8. The semiconductor package according to claim 7, wherein the second chip is provided with a plurality of power/ground (P/G) pads on a fourth side between the second side and the third side.

9. The semiconductor package according to claim 8 further comprising a plurality of third bonding wires directly connecting the P/G pads to corresponding gold fingers on the first surface of the carrier substrate.

10. The semiconductor package according to claim 1 further comprising an encapsulant covering the first chip and the second chip.

* * * * *